United States Patent
Go

(10) Patent No.: US 7,521,714 B2
(45) Date of Patent: Apr. 21, 2009

(54) CAPACITOR AND MANUFACTURING METHOD THEREOF

(75) Inventor: Han Suk Go, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 127 days.

(21) Appl. No.: 11/616,302

(22) Filed: Dec. 27, 2006

(65) Prior Publication Data

US 2007/0146963 A1      Jun. 28, 2007

(30) Foreign Application Priority Data

Dec. 28, 2005   (KR) .................... 10-2005-0132706

(51) Int. Cl.
*H01L 27/108* (2006.01)
*H01L 29/00* (2006.01)
*H01L 31/036* (2006.01)
*H01L 31/112* (2006.01)
*H01L 27/088* (2006.01)

(52) U.S. Cl. .................... 257/68; 257/532; 257/386; 257/295

(58) Field of Classification Search ................. 257/532, 257/E21.396, 68, 295–312, 533, 596, 601, 257/602, 923, 924, 516; 361/272, 303; 438/386
See application file for complete search history.

(56) References Cited

U.S. PATENT DOCUMENTS

| 2005/0019697 A1* | 1/2005 | Tang et al. ................. 430/296 |
| 2006/0234443 A1* | 10/2006 | Yang et al. ................. 438/253 |

* cited by examiner

*Primary Examiner*—Chuong A. Luu
(74) *Attorney, Agent, or Firm*—Saliwanchik, Lloyd & Saliwanchik

(57) ABSTRACT

A capacitor capable of being formed in a vertical plane without an additional mask process and/or deposition process and a method of manufacturing the same are provided. The capacitor includes: a first conductive line formed on a substrate; a first interlayer dielectric including a first via hole formed at an upper portion of the first conductive line, and a second and third via hole pair formed at a region of the substrate; a first barrier metal layer and a contact plug formed in the first via hole; and first and second capacitor electrodes formed in the second and third via holes, respectively. The first and second capacitor electrodes and the first interlayer dielectric disposed between the first and second capacitor electrodes form a vertically constructed capacitor.

9 Claims, 4 Drawing Sheets

CAPACITOR AND MANUFACTURING METHOD THEREOF

RELATED APPLICATION(S)

This application claims priority under 35 U.S.C. §119 (e) of Korean Patent Application No. 10-2005-0132706 filed Dec. 28, 2005, which is incorporated herein by reference in its entirety.

FIELD OF THE INVENTION

The present invention relates to a capacitor and a method for manufacturing the same.

BACKGROUND OF THE INVENTION

A merged memory logic (MML) device is an integrated device that incorporates a memory cell array, such as a dynamic random access memory (DRAM), and an analog or a peripheral circuit into a single chip. Since multimedia functions have been enhanced by the introduction of the MML, it is possible to efficiently achieve integration and high-speed of semiconductor devices.

Development is underway for manufacturing a capacitor having high capacitance for an analog circuit in which high-speed operation is needed. There are two main types of capacitors used in analog circuits. They are polysilicon/insulator/polysilicon (PIP) type capacitors and metal/insulator/metal (MIM) type capacitors. In general, because conductive polysilicon is used for the upper and lower electrodes of a PIP type capacitor, a natural oxide forms due to an oxidation occurring at the interface between the upper/lower electrode and a dielectric thin layer. Because of the natural oxide formation, the conventional PIP capacitor has a defect that lowers its capacitance.

In addition, the capacitance decreases due to a depletion region formed on a polysilicon layer. Thus, there is a disadvantage in that the PIP capacitor is not suitable for high-speed and high-frequency operations. To overcome these disadvantages, a metal-insulator-silicon (MIS) or a metal-insulator-metal (MIM) is used. The MIM type capacitor is generally used for high performance semiconductor devices because it has low resistivity and does not cause parasitic capacitance derived from the depletion.

Hereinafter, a related art capacitor will be described with reference to the accompanying drawings.

FIG. 1 is a sectional view of showing a structure of a MIM capacitor according to the related art.

As shown in FIG. 1, a capacitor according to the related art includes a first interlayer dielectric 10 having the first contact hole formed on a substrate. A Metal-Insulator-Metal (MIM) type capacitor is formed at an upper portion of the first interlayer dielectric 10. The MIM type capacitor includes a first conductive layer 11, a first insulating layer 13, and a second conductive layer 14, which are sequentially deposited at an upper portion of the first interlayer dielectric 10. Here, a second interlayer dielectric 15 is formed on an entire surface of the substrate including the MIM type capacitor. The first conductive layer 11, functioning as a lower electrode of the capacitor, is connected to a third conductive layer 17a formed on the second interlayer dielectric 15 through a first plug 16, which is formed in a second contact hole.

In addition, the second conductive layer 14, functioning as an upper electrode of the capacitor, is connected to a fourth conductive layer 17b formed on the second interlayer dielectric 15 through a second plug 20, which is formed in a third contact hole In the capacitor according to the related art, a first conductive layer 11, a first insulating layer 13, and a second conductive layer 14 are flatly constructed of layers in horizontal planes. In order to increase the capacitance through increasing the surface area of the electrodes, the related art capacitor is expanded along the horizontal plane.

Accordingly, in the capacitor according to the related art, there is a limit to increasing the length and width of a capacitor with a defined area.

BRIEF SUMMARY

Accordingly, embodiments of the present invention are directed to a capacitor and a method for manufacturing the same that substantially obviates one or more problems due to limitations and/or disadvantages of the related art.

Accordingly, it is an object of embodiments of the present invention to provide a capacitor capable of being formed in a vertical plane without an additional mask process or deposition process and a method of manufacturing the same.

Additional advantages, objects, and features of the invention will be set forth in part in the description which follows and in part will become apparent to those having ordinary skill in the art upon examination of the following or may be earned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a capacitor comprising: a first conductive line formed on a substrate; a first interlayer dielectric having a first via hole formed at an upper portion of the first conductive line, and a second and third via hole pair formed at one region of the substrate; a first barrier metal layer and a contact plug formed in the first via hole; a first capacitor electrode formed in the second via hole; and a second capacitor electrode formed in the third via hole, wherein the first and second capacitor electrodes and the first interlayer dielectric disposed between the first and second capacitor electrodes form a vertically constructed capacitor.

In another aspect of the present invention, there is provided a method for manufacturing a capacitor comprising: forming a first conductive line on a substrate; forming a first interlayer dielectric on the substrate including the first conductive line; forming a first via hole through the first interlayer dielectric at an upper portion of the first conductive line, and forming a second and third via hole pair being adjacent to each other through the first interlayer dielectric at a region of the substrate; forming a first barrier metal layer and a contact plug in the first via hole; and forming first and second capacitor electrodes in the second and third via holes, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for manufacturing a semiconductor device according to an embodiment of the present invention will be described with reference to the accompanying drawings.

In the description of an embodiment of the present invention, when something is formed "on" each layer, the "on" includes the concepts of "directly and indirectly".

Figure 1:
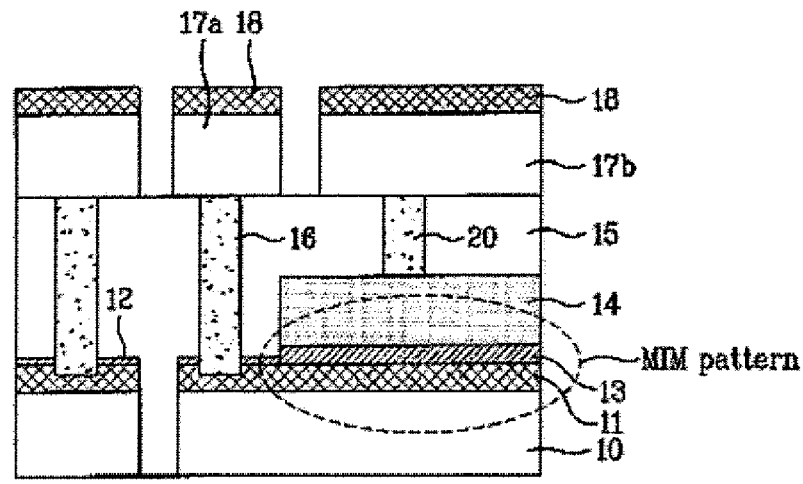
FIG. 1 is a view for showing a structure of a capacitor according to the related art.
Figure 2:
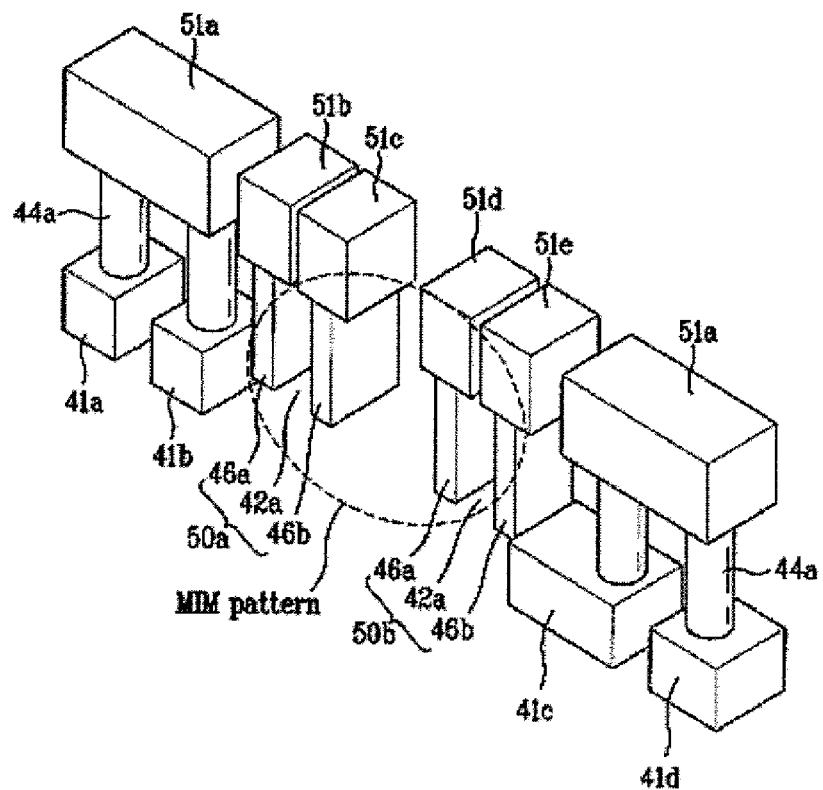
FIG. 2 is a view showing a capacitor and a peripheral metal layer thereof according to an embodiment of the present invention.
Figure 3:
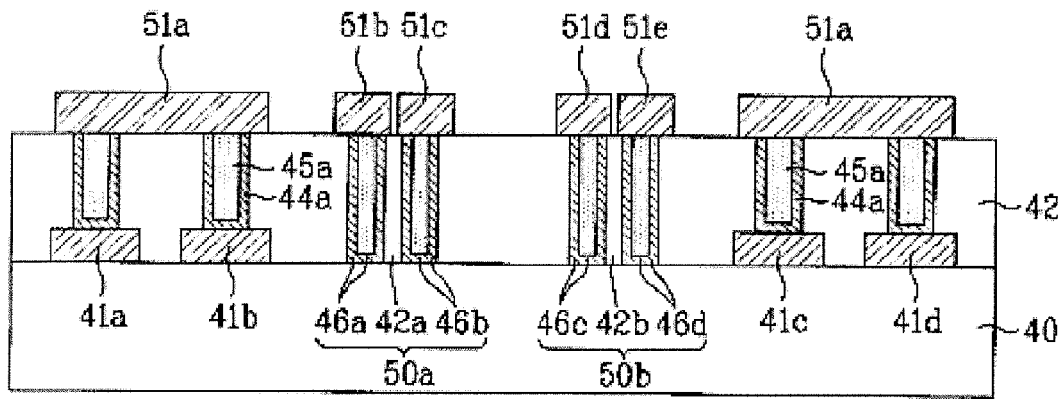
FIG. 3 is a cross-sectional view for showing a structure of a capacitor according to an embodiment of the present invention.

FIG. 2 is a view showing a capacitor and a peripheral metal layer thereof according to an embodiment of the present invention. FIG. 3 is a cross-sectional view for showing a structure of a capacitor according to an embodiment of the present invention.

As shown in FIGS. 2 and 3, a capacitor according to an embodiment of the present invention includes a plurality of first conductive lines 41a, 41b, 41c, and 41d and a first interlayer dielectric 42. The plurality of first conductive lines 41a, 41b, 41c, and 41d can be formed on a semiconductor substrate 40. The first interlayer dielectric 42 can be formed on the semiconductor substrate 40 including on the plurality of first conductive lines 41a, 41b, 41c, and 41d.

Figure 5A:
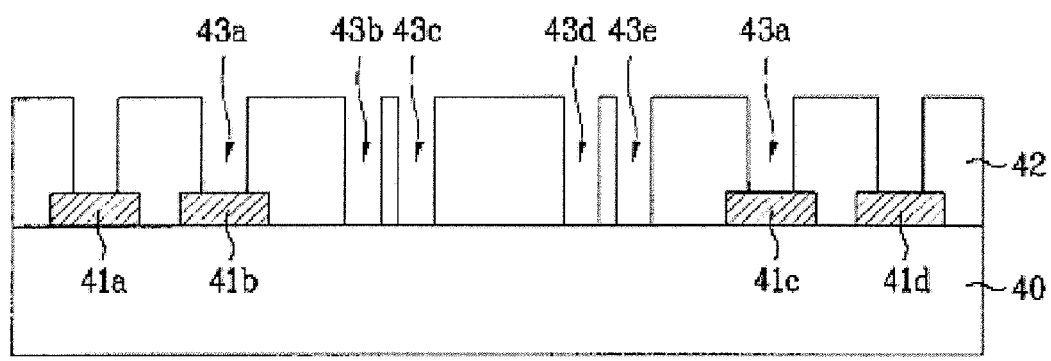

As shown in FIG. 5A, first via holes 43a can be formed through the first interlayer dielectric 42 at the first conductive lines 41a, 41b, 41c, and 41d. Second and third via holes 43b and 43c, and fourth and fifth via holes 43d and 43e can be formed through the first interlayer dielectric 42 at one region of a semiconductor substrate 40 in pairs of two adjacent via holes.

Figure 5B:
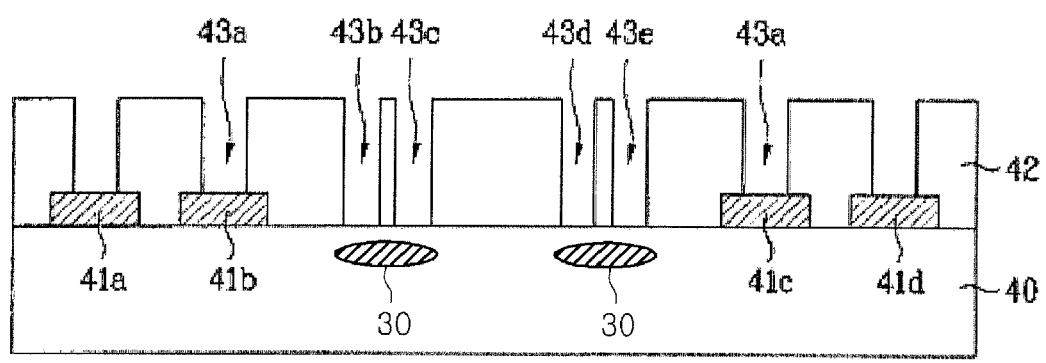

As shown in FIG. 5B, a conductive ion can be implanted in the semiconductor substrate 40 below the second and third via holes 43b and 43c, and fourth and fifth via holes 43d and 43e.

Although two pairs of via holes are descried in this embodiment, the present invention is not limited thereto. That is, more pairs of via holes can be formed.

Referring again to FIGS. 2 and 3, a first barrier metal layer 44a and a contact plug 45a can be formed in the first via holes 43a, which are formed on the first conductive lines 41a, 41b, 41c, and 41d. First and second capacitor electrodes 46a and 46b can be formed in the second and third via holes 43b and 43c, and are made of the barrier metal layer and the contact plug formation material. Third and fourth capacitor electrodes 46c and 46d are also formed in the fourth and fifth via holes 43d and 43e, and are made of the barrier metal layer and the contact plug formation material.

First and second dielectric layers 42a and 42b remain between the first and second capacitor electrodes 46a and 46b, and between the third and fourth capacitor electrodes 46c and 46d.

That is, a Metal-Insulator-Metal (MIM) type first capacitor 50a of a vertical construction is composed of the first and second capacitor electrodes 46a and 46b and the first capacitor dielectric layer 42a disposed between the first and second capacitor electrodes 46a and 46b. In addition, a MIM type second capacitor 50b of a vertical construction is composed of the third and fourth capacitor electrodes 46c and 46d and the second capacitor dielectric layer 42b disposed between the third and fourth capacitor electrodes 46c and 46d.

A second conductive line 51a can be connected to the first barrier metal layer 44a and the contact plug 45a, which are formed in the first via holes 43a. Conductive pads 51b, 51c, 51d, and 51e can be formed at upper portions of the first and second capacitor electrodes 46a and 46b, and the third and fourth capacitor electrodes 46c and 46d, respectively.

As describe above, the first and second capacitor electrodes can be formed in pairs of via holes. One vertical capacitor is composed of the first and second capacitor electrode and a first interlayer dielectric remaining between the first and second capacitor electrodes.

The following is a description of a method for manufacturing a capacitor according to an embodiment of the present invention having a construction illustrated above.

FIGS. 4 through 8 are cross-sectional views for describing a method for manufacturing a capacitor according to an embodiment of the present invention.

Figure 4:
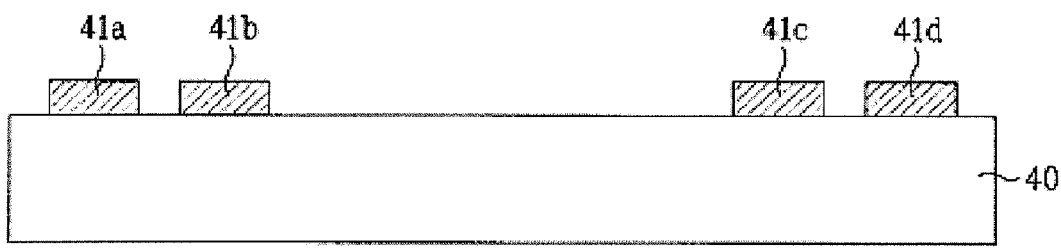
FIGS. 4 through 8 are cross-sectional views for illustrating a method for manufacturing the capacitor according to an embodiment of the present invention.

Referring to FIG. 4, a first conductive layer can be deposited on a semiconductor substrate 40. Then, a first photoresist layer (not shown) can be coated on the first conductive layer, and selectively patterned.

Next, the first conductive layer can be etched using the patterned first photoresist layer as a mask to form first conductive lines 41a, 41b, 41c, and 41d.

Then, referring to FIG. 5A, a first interlayer dielectric 42 can be deposited on the semiconductor substrate 40 including the first conductive lines 41a, 41b, 41c, and 41d. A second photoresist layer can be coated on the substrate and patterned to expose the first conductive lines 41a, 41b, 41c, and 41d and a region of the semiconductor substrate 40. First via holes 43a to contact the first conductive lines 41a, 41b, 41c, and 41d, and a pair of second and third via holes 43b and 43c and a pair of fourth and fifth via holes 43d and 43e to contact a region of the semiconductor substrate 40 that can be formed using the patterned second photoresist layer as a mask.

As shown in FIG. 5B, a conductive ion can be implanted in the semiconductor substrate 40 disposed at lower portions of the second and third via holes 43b and 43c, and fourth and fifth via holes 43d and 43e.

Although only two pairs of via holes have been described, the present invention is not limited thereto. That is, more via holes can be formed.

Figure 6:
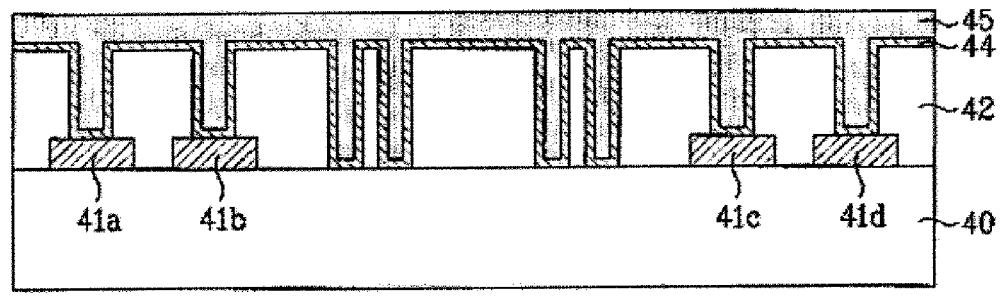

Referring to FIG. 6, a first barrier metal layer 44 and a second conductive layer 45 can be formed on the first interlayer dielectric 42 including the first to fifth via holes 43a, 43b, 43c, 43d, and 43d. Here, the second conductive layer 45 can form a plug. In a specific embodiment, the second conductive layer can be formed of tungsten.

Figure 7:
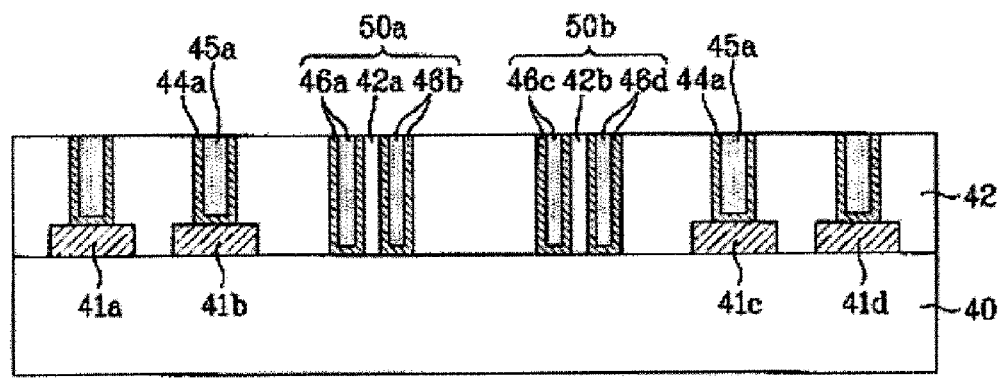

Then, as shown in FIG. 7, the first barrier metal layer 44 and the second conductive layer 45 can be planarized by a chemical mechanical polishing process to expose the first interlayer dielectric 42.

Accordingly, a first barrier metal layer 44a and a contact plug 45a are formed in the first via holes 43a at upper portions of the first conductive lines 41a, 41b, 41c, and 41d. First and second capacitor electrodes 46a and 46b are formed in the second and third via holes 43b and 43c, respectively, and are composed of the barrier metal layer and a contact plug formed of the second conductive layer. In the same manner, third and fourth capacitor electrodes 46c and 46d are formed in the fourth and fifth via holes 43d and 43e, respectively, and are composed of the barrier metal layer and a contact plug formed of the second conductive layer.

Moreover, the first dielectric layer 42 between each via hole pair functions as first and second capacitor dielectric layers 42a and 42b between the first and second capacitor electrodes 46a and 46b, and between the third and fourth capacitor electrodes 46c and 46d, respectively.

That is, a MIM type first capacitor 50a of a vertical construction can be composed of the first and second capacitor electrodes 46a and 46b, and the first capacitor dielectric layer 42a formed therebetween. Further, a MIM type second capacitor 50b of a vertical construction can be composed of the third and fourth capacitor electrodes 46c and 46d and the second capacitor dielectric layer 42b formed therebetween.

Figure 8:
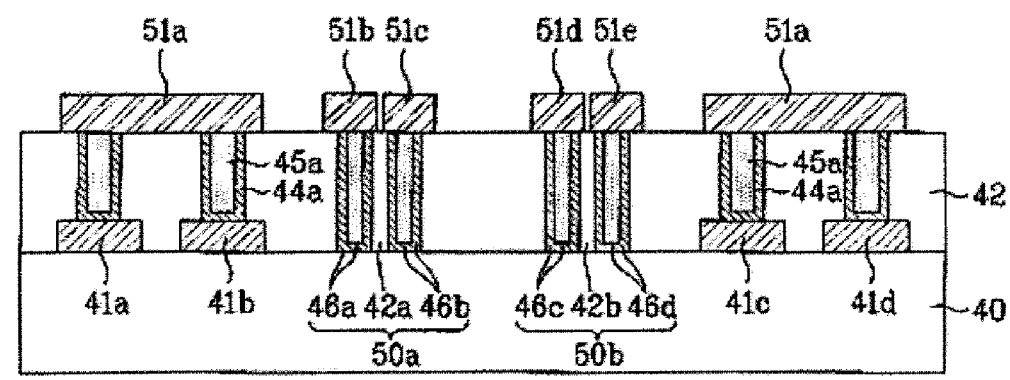

Next, referring to FIG. 8, a third conductive layer can be deposited on the first interlayer dielectric 42, and a third photoresist layer can be coated and patterned thereon. Then, the third conductive layer can be selectively etched using the patterned third photoresist layer as a mask to form a second conductive line 51a on the first barrier metal layer 44a and the contact plug 45a formed in the first via holes 43a and conductive pads 51b, 51c, 51d, and 51e at upper portions of each of the first and second capacitor electrodes 46a and 46b, and third and fourth capacitor electrodes 46c and 46d.

Through the aforementioned process, first and second capacitor electrodes are formed in a pair of via holes. The first and second capacitor electrodes can form one vertical capacitor with an interlayer dielectric between the first and second capacitor electrodes.

As is clear from the forgoing description, in the capacitor and the method for manufacturing the same according to embodiments of the present invention, the present invention can provide a capacitor of a vertical construction during a formation of a via hole and a formation of a barrier metal layer and a contact hole in the via hole without an additional mask It should be understood that the examples and embodiments described herein are for illustrative purposes only and that various modifications or changes in light thereof will be suggested to persons skilled in the art and are to be included within the spirit and purview of this application.

I claim:

1. A capacitor comprising:
 a first conductive line formed on a substrate;
 a first interlayer dielectric formed on the substrate, the first interlayer dielectric comprising a first via hole formed at an upper portion of the first conductive line, and a second via hole and third via hole pair formed at a region of the substrate, not on the first conductive line;
 a first barrier metal layer and a contact plug formed in the first via hole;
 a first capacitor electrode formed in the second via hole and a second capacitor electrode formed in the third via hole,
 wherein the first capacitor electrode and the second capacitor electrode form a capacitor of vertical construction with the first interlayer dielectric disposed between the first and second capacitor electrodes functioning as a capacitor dielectric.

2. The capacitor according to claim 1, further comprising a conductive ion layer formed in the substrate at lower portions of the second and third via holes.

3. The capacitor according to claim 1, wherein the first and second capacitor electrodes are formed of a barrier metal layer and a contact plug material formed in the second and third via holes, respectively.

4. The capacitor according to claim 1, wherein a first conductive pad is formed on the first interlayer dielectric at an upper portion of the first capacitor electrode and a second conductive pad is formed on the first interlayer dielectric at an upper portion of the second capacitor electrode.

5. A method for manufacturing a capacitor, comprising:
 forming a first conductive line on a substrate;
 forming a first interlayer dielectric on the substrate and the first conductive line;
 forming first, second, and third via holes through the first interlayer dielectric, wherein the first via hole is formed at an upper portion of the first conductive line, and the second and third via holes are formed as a pair at a region of the substrate, not on the first conductive line;
 forming a first barrier metal layer and a contact plug in the first via hole; and
 forming first and second capacitor electrodes in the second and third via holes, respectively.

6. The method according to claim 5, wherein the first and second capacitor electrodes and the first interlayer dielectric remaining between the second and third via holes constitute one vertical capacitor.

7. The method according to claim 5, wherein forming a first barrier metal layer and a contact plug in the first via hole and forming first and second capacitor electrodes in the second and third via holes, respectively, are simultaneously performed.

8. The method according to claim 5, wherein forming a first barrier metal layer and a contact plug in the first via hole and forming first and second capacitor electrodes in the second and third via holes, respectively, comprises:
 depositing a first barrier metal layer and a first conductive layer on the first interlayer dielectric including the first, second and third via holes; and
 planarizing the first barrier metal layer and the first conductive layer by a chemical mechanical polishing process to expose the first interlayer dielectric.

9. The method according to claim 5, further comprising forming a first conductive pad on the first capacitor electrode and a second conductive pad on the second capacitor electrode.

* * * * *